US006667663B2

(12) United States Patent
Ozawa

(10) Patent No.: US 6,667,663 B2
(45) Date of Patent: Dec. 23, 2003

(54) PHASE LOCKED LOOP CIRCUIT

(75) Inventor: Seiichi Ozawa, Wakoh (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/197,650

(22) Filed: Jul. 16, 2002

(65) Prior Publication Data

US 2003/0011437 A1 Jan. 16, 2003

Related U.S. Application Data

(63) Continuation of application No. PCT/JP00/00170, filed on Jan. 17, 2000.

(51) Int. Cl.[7] ................................................ H03L 7/00
(52) U.S. Cl. ........................................... 331/17; 327/16
(58) Field of Search ............................ 331/17, 16, 15, 331/18, 23; 327/147, 156; 375/375, 376

(56) References Cited

U.S. PATENT DOCUMENTS 5,412,353 A * 5/1995 Chaplik et al. ............. 332/127
5,625,325 A * 4/1997 Rotzoll et al. ................ 331/16
6,236,275 B1 * 5/2001 Dent .......................... 331/1 A

FOREIGN PATENT DOCUMENTS

| JP | 63-211819 | 9/1988 |
| JP | 1-215122 | 8/1989 |
| JP | 8-63892 | 3/1996 |
| JP | 9-289447 | 11/1997 |

* cited by examiner

*Primary Examiner*—Timothy P. Callahan
*Assistant Examiner*—Linh Nguyen
(74) *Attorney, Agent, or Firm*—Katten Muchin Zavis Rosenman

(57) ABSTRACT

A PLL circuit having a gain control function includes: a first phase comparator for outputting a first phase difference signal indicating a phase difference between a first input signal and a second input signal; a first loop filter for smoothing a signal based on the first phase difference signal and outputting a first control voltage; a VCO for oscillating at a frequency based on the first control voltage and thereby outputting a first clock; and a dummy VCO having characteristics identical with those of the VCO for oscillating at a frequency based on a second control voltage and thereby outputting a second clock.

10 Claims, 13 Drawing Sheets

PHASE LOCKED LOOP CIRCUIT

This is a continuation of International PCT Application NO. PCT/JP00/00170 filed Jan. 17, 2000 which was not published in English.

BACKGROUND OF THE INVENTION

1. Field of the Invention

The present invention relates to a PLL (Phase Locked Loop) circuit, and particularly to control of gain of the PLL circuit.

2. Description of the Related Art

A PLL circuit effects feedback control to keep a phase difference between an input signal and an output signal of an oscillator constant. A PLL circuit is used for extracting a clock in optical communication or the like. FIG. 16 is a block diagram of a conventional PLL circuit. As shown in FIG. 16, the PLL circuit is formed by a phase comparator 2, a charge pump 4, a low pass filter (LPF) 6, and a voltage-controlled oscillator circuit (VCO) 8. The phase comparator 2 compares the phases of input data such as NRZ data and an output clock of the VCO 8 with each other, and then outputs to the charge pump 4 a phase difference signal indicating a phase difference (indicating the phase difference by a pulse width, for example). The charge pump 4 converts the phase difference signal into a current, and then outputs an output current. The LPF 6 smoothes the output current. The VCO 8 oscillates at an oscillation frequency according to an output voltage of the LPF 6 to output the clock. The output clock of the VCO 8 is inputted to the phase comparator 2 for feedback to the VCO 8, whereby the clock in synchronism with the input data is obtained.

FIG. 17 is a block diagram of FIG. 16. From FIG. 17, a closed loop gain of a feedback loop of the PLL circuit is expressed by an equation (1). An open loop gain of the PLL circuit is expressed by an equation (2).

$$\text{Open loop gain} = K_{ph} \cdot I_{pmp} \cdot F(s) \cdot K_v / s \qquad (1)$$

$$\text{Closed loop gain} = \Phi_{out}/\Phi_{in} = K_{ph} \cdot I_{pmp} \cdot F(s) \cdot K_v / \{s + K_{ph} \cdot I_{pmp} \cdot F(s) \cdot K_v\} \qquad (2)$$

where Kph is a gain of the phase comparator, for example pulse width/phase difference (s/rad); Ipmp is a current amplitude value (A) of the charge pump; F(s) is a transfer function of the LPF, for example a voltage/current value (Ω); and Kv is a gain of the VCO, or frequency/voltage (Hz/V).

FIG. 18 is a diagram showing a complete second-order type loop filter. F(s) of the complete second-order type loop shown in FIG. 18 is expressed by an equation (3).

$$F(s) = R1(1 + 1/sC1R1) \qquad (3)$$

The open loop gain and the closed loop gain when the complete second-order type loop filter is used in the PLL circuit are expressed by equations (4) and (5) by substituting the equation (3) into each of the equations (1) and (2).

$$\text{Open loop gain} = (K_{ph} \cdot I_{pmp} \cdot K_v R1/s) \cdot (1 + 1/sC1R1) \qquad (4)$$

$$\text{Closed loop gain} = \{K_{ph} \cdot I_{pmp} \cdot K_v \cdot (1 + sC1R1)\} / \{s^2 C1 + K_{ph} \cdot I_{pmp} \cdot K_v \cdot (1 + sC1R1)\} \qquad (5)$$

FIG. 19 and FIG. 20 are diagrams showing frequency characteristics of the PLL circuit expressed by the equations (4) and (5). In FIG. 19 and FIG. 20, an upper diagram shows a gain characteristic and a phase characteristic of the open loop gain, and a lower diagram shows the closed loop gain. FIG. 19 shows a case where the loop gain is large, and FIG. 20 shows a case where the loop gain is small. The open loop gain is decreased in a range of a low frequency side to 1/R1C1 at 12 dB/oct, and decreased in a range higher than 1/R1C1 at 6 dB/oct. Cut-off frequency of the closed loop gain is a frequency at which the open loop gain is substantially 0 dB, and is in proportion to a loop gain expressed by an equation (6).

$$\text{Cut-off frequency of the closed loop gain} \approx \text{loop gain} = K_{ph} \cdot I_{pmp} \cdot K_v \cdot R1 \qquad (6)$$

It is to be noted that the equation (6) assumes 1<<R1C1.

Thus, the cut-off frequency of the closed loop gain is increased in proportion to each of the gains of the phase comparator, the charge pump, and the VCO.

In the case of a large loop gain as shown in FIG. 19, a phase margin is large (90 deg), and the cut-off frequency is high. In the case of a small loop gain as shown in FIG. 20, on the other hand, the phase margin is decreased (about 45 deg), whereby a higher peaking results, and the cut-off frequency is decreased. When the cut-off frequency is increased, high-frequency phase fluctuations are not cut, and thus jitter is increased. When the phase margin is decreased and a higher peaking results, on the other hand, phase fluctuations, or jitter is increased. The closed loop gain characteristic is generally defined by jitter transfer. The closed loop gain of a PLL circuit used for extracting a clock in optical communication and the like is defined by an ITU-T recommendation G958 STM-1 jitter transfer specification.

FIG. 21 is a diagram showing the ITI-T recommendation G958 STM-1 jitter transfer specification. As shown in FIG. 21, this specification specifies that the cut-off frequency be 130 kHz or lower, and the peaking be 0.1 dB or lower. FIG. 22 is a diagram showing PLL frequency characteristics when the loop gain is varied. When the loop gain is too small, the peaking specification cannot be satisfied, as shown in FIG. 22. When the loop gain is too large, on the other hand, the cut-off specification cannot be satisfied, as shown in FIG. 22. Accordingly, in order to satisfy the jitter transfer specification, the loop gain of the PLL circuit needs to be designed to fall between a lower limit value determined by the peaking specification and an upper limit value determined by the cut-off frequency specification.

When a VCO for operating at a high frequency is designed, however, the gain KV of the VCO is varied greatly depending on the process, temperature, and power supply voltage. Therefore, the loop gain is varied greatly, which makes it difficult to satisfy the jitter transfer characteristic. In order to deal with this problem, Japanese Patent Application No. Hei 8-310804 discloses that the loop gain of a PLL circuit is compensated by detecting the VCO gain from a frequency converging characteristic of the PLL circuit. In this example, the VCO gain Kv is detected from a temporal change in VCO control voltage in a converging stage of the PLL circuit. The temporal change in the VCO control voltage is sampled by an A/D converter and calculated by a DSP to thereby detect and compensate the VCO gain. However, in order to detect the temporal change in the VCO control voltage, the PLL circuit needs to be unlocked at some point. It is therefore not possible to respond to a change in the VCO gain due to a variation in the temperature or power supply voltage during continuous operation as of a communication apparatus or the like. In addition, the circuit is complicated because the A/D converter circuit and the DSP are required.

SUMMARY OF THE INVENTION

It is accordingly an object of the present invention to provide a PLL circuit that measures the VCO gain during continuous operation with a simple circuit configuration and makes the gain of the PLL circuit constant.

In accordance with an aspect of the present invention, there is provided a PLL circuit having a gain control function, the PLL circuit including: a first phase comparator for outputting a first phase difference signal indicating a phase difference between a first input signal and a second input signal; a first loop filter for smoothing a signal based on the phase difference signal and outputting a first control voltage; a first VCO for oscillating at a frequency based on the first control voltage and thereby outputting a first clock; a dummy VCO having characteristics identical with those of the first VCO for oscillating at a frequency based on a second control voltage and thereby outputting a second clock; a VCO gain detecting circuit for detecting a gain of the first VCO on the basis of a frequency difference between the first clock and the second clock and a voltage difference between the first control voltage and the second control voltage; and a gain control circuit for effecting control so as to make a loop gain constant on the basis of the gain of the first VCO detected by the VCO gain detecting circuit; wherein the second input signal is a signal based on the first clock.

In accordance with another aspect of the present invention, there is provided a PLL circuit having a gain control function, the PLL circuit including: a phase comparator for detecting a phase difference between digital data and a second input signal at a rising edge or a falling edge of the digital data, and outputting a first phase difference signal; a loop filter for smoothing a signal based on the phase difference signal and outputting a control voltage; a VCO for oscillating at a frequency based on the control voltage and thereby outputting a clock; a phase comparator gain detecting circuit for detecting an edge rate, or a rate of rising edges or falling edges of the digital data in a given time; and a gain control circuit for effecting control so as to make a loop gain constant on the basis of the edge rate detected by the phase comparator gain detecting circuit; wherein the second input signal is a signal based on the first clock.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
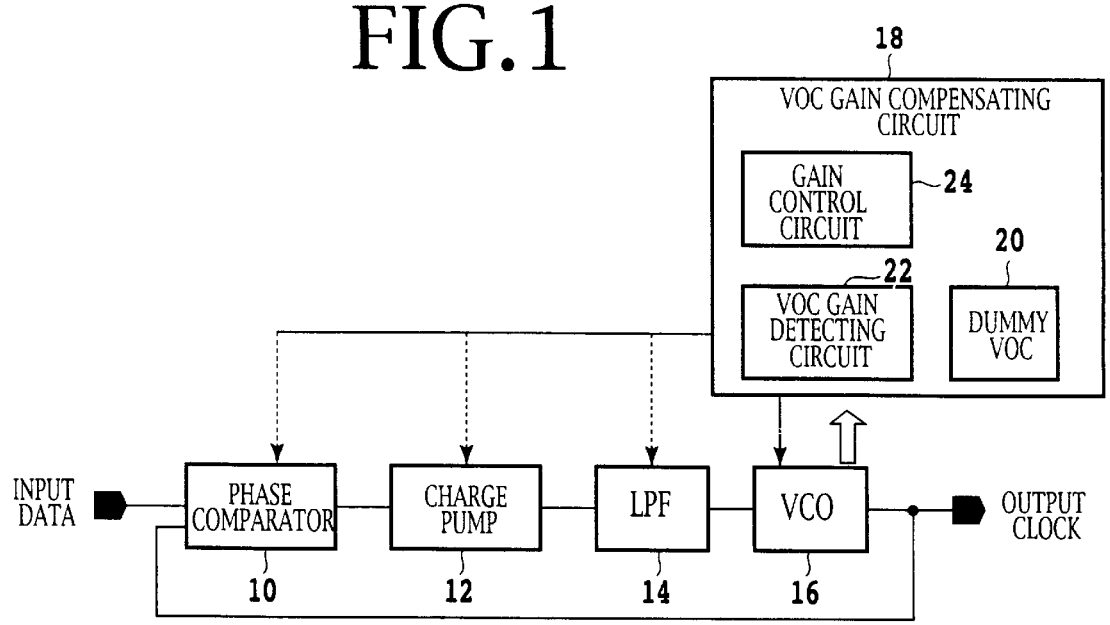
FIG. 1 is a diagram of assistance in explaining principles of the present invention.

Principles of the present invention will be described prior to description of the best mode for carrying out the invention. FIG. 1 is a diagram of assistance in explaining principles of the present invention. As shown in FIG. 1, a PLL circuit has a phase comparator 10, a charge pump 12, an LPF 14, a VCO 16, and a VCO gain compensating circuit 18. The VCO gain compensating circuit 18 has a dummy VCO 20, a VCO gain detecting circuit 22 and a gain control circuit 24. The phase comparator 10 is supplied with input data such as NRZ data in optical communication or the like and an output clock of the VCO 16. The phase comparator 10 detects a phase difference between the input data and the output clock of the VCO 16, and then outputs a phase difference signal indicating the phase difference. The phase difference signal indicates the phase difference by a pulse width, for example. The charge pump 12 converts the phase difference signal into a current, and then outputs the current to the LPF 14. The LPF 14 converts the output current of the charge pump 12 into a voltage V, and then outputs the voltage V to the VCO 16. The VCO 16 oscillates at a frequency according to the voltage V to output the clock.

A gain of the VCO 16 is varied according to an operating environment. The VCO gain detecting circuit 22 detects the gain of the VCO 16 using the dummy VCO 20 having characteristics identical with those of the VCO 16. The VCO gain detecting circuit 22 can detect the gain of the VCO 16 from output frequency of the VCO 16 in operation when the PLL circuit is locked, output frequency of the dummy VCO 20 when a voltage (V+ΔV) obtained by adding an offset voltage ΔV to the voltage V is applied to the dummy VCO 20, and the offset voltage ΔV, for example. The gain control circuit 24 controls the gain of the phase comparator 10, the charge pump 12, the LPF 14, or the VCO 16 on the basis of the gain of the VCO 16 so as to make a loop gain of the PLL circuit constant. Thus, even when the gain of the VCO 16 is varied, it is possible to make the gain of the PLL circuit constant while the PLL circuit is operating.

First Embodiment

Figure 2:
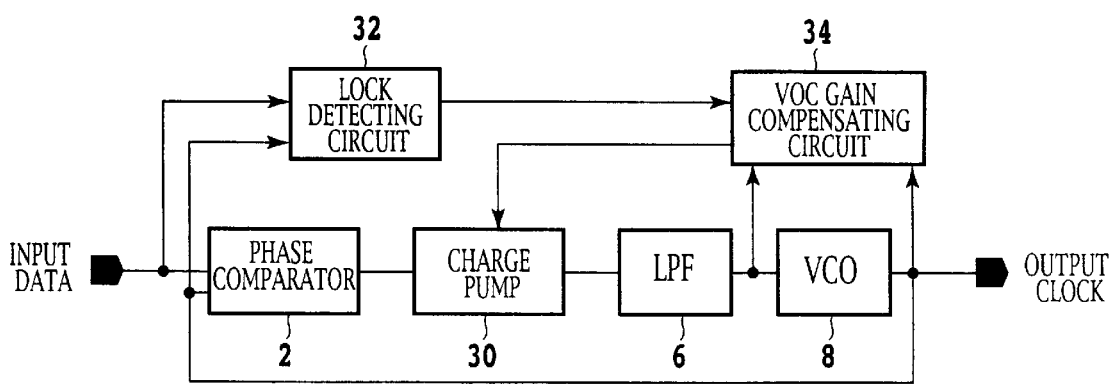
FIG. 2 is a block diagram of a PLL circuit according to a first embodiment of the present invention.
Figure 16:
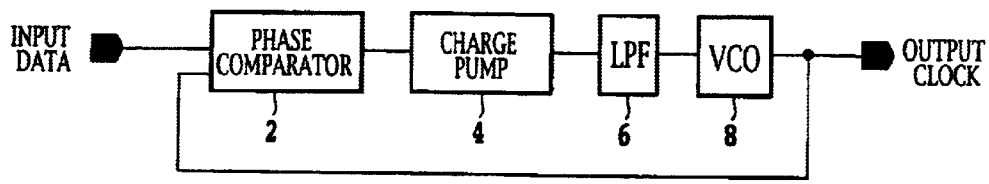
FIG. 16 is a block diagram of a conventional PLL circuit.
Figure 17:
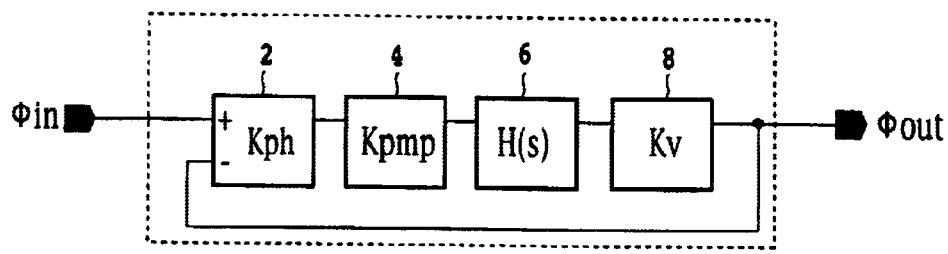
FIG. 17 is a block diagram of a PLL circuit.

FIG. 2 is a block diagram of a PLL circuit according to a first embodiment of the present invention. In the figure, substantially the same components as components in FIG. 16 are identified by the same reference numerals. The PLL circuit shown in FIG. 2 is used for a clock extracting circuit for optical communication or the like. The PLL circuit has a phase comparator 2, a charge pump 30, an LPF 6, a VCO 8, a lock detecting circuit 32, and a VCO gain compensating circuit 34. The phase comparator 2 detects a phase difference between input data and an output clock of the VCO 8, and then outputs a phase difference signal formed by a pulse signal indicating the phase difference by a pulse width and an UP/DOWN signal indicating phase delay/advance. The charge pump 30 includes: a positive current source circuit and a negative current source circuit having an output amplitude current value Ipmp controlled by the VCO gain compensating circuit 34; a first switch for connection between the positive constant current source circuit and the LPF 6; and a second switch for connection between the negative constant current source circuit and the LPF 6. The first/second switch is turned on by the UP/DOWN signal for the pulse width of the pulse signal to output an output current Ipmp or −Ipmp to the LPF 6.

Figure 18:
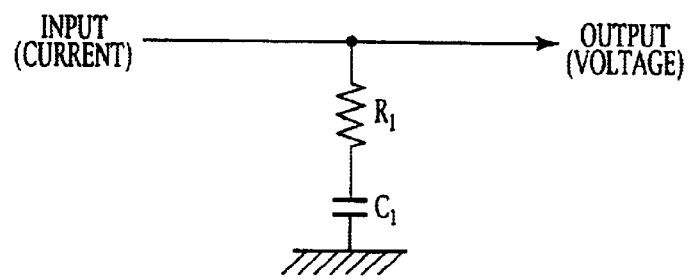
FIG. 18 is a diagram showing an example of an LPF.
Figure 19:
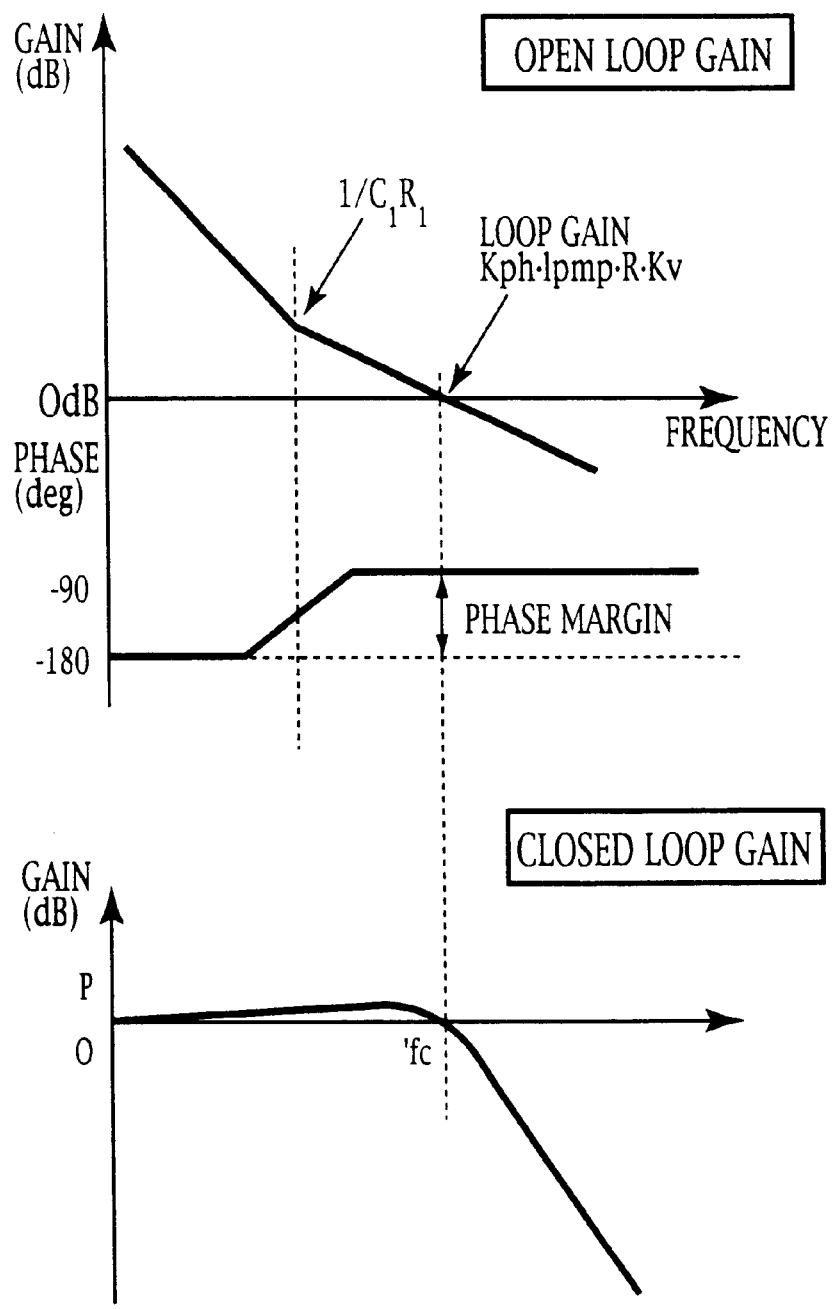
FIG. 19 is a frequency characteristic diagram of the PLL circuit (when a loop gain is large)
Figure 20:
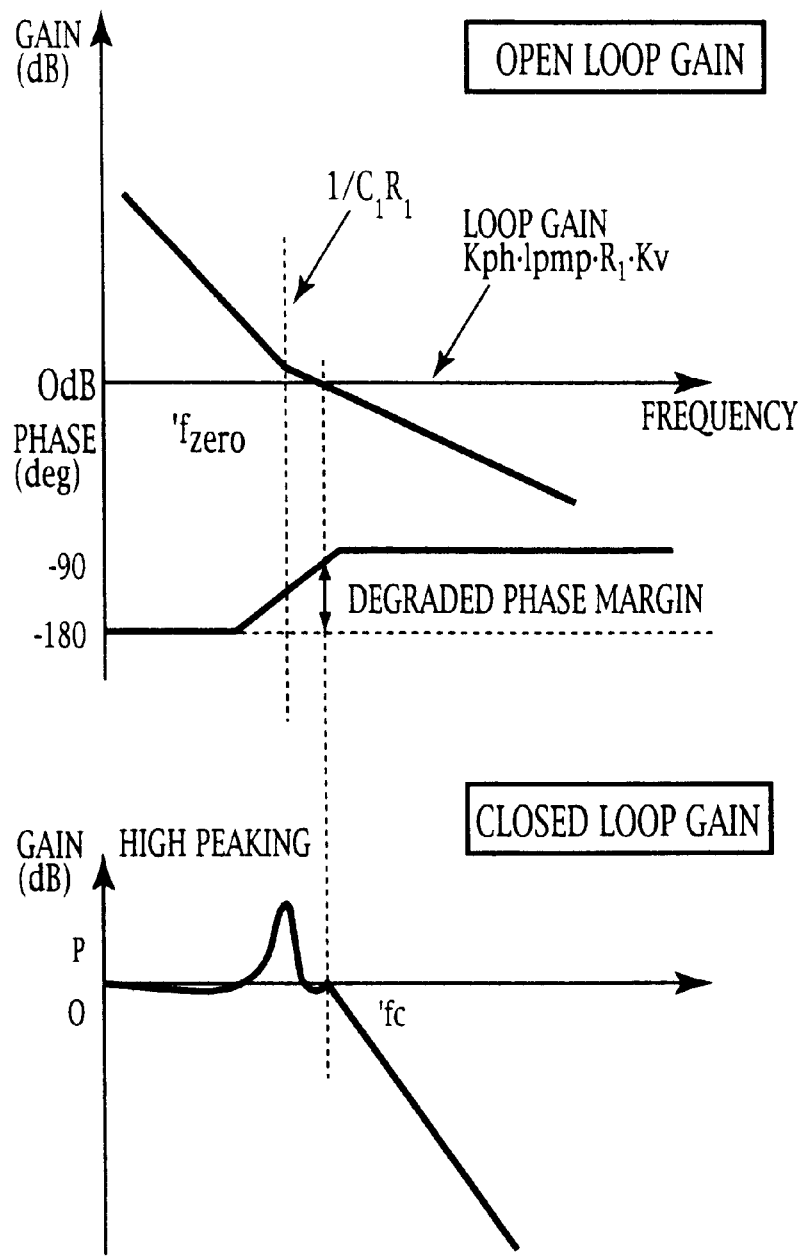
FIG. 20 is a frequency characteristic diagram of the PLL circuit (when the loop gain is small)
Figure 21:
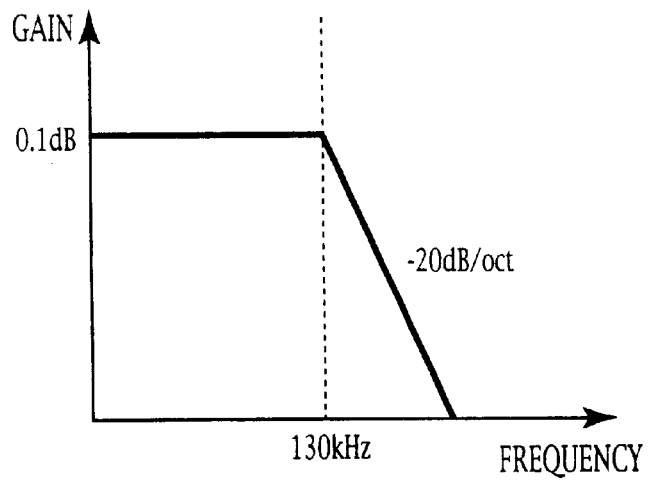
FIG. 21 is a diagram of an example of a PLL frequency characteristic specification.
Figure 22:
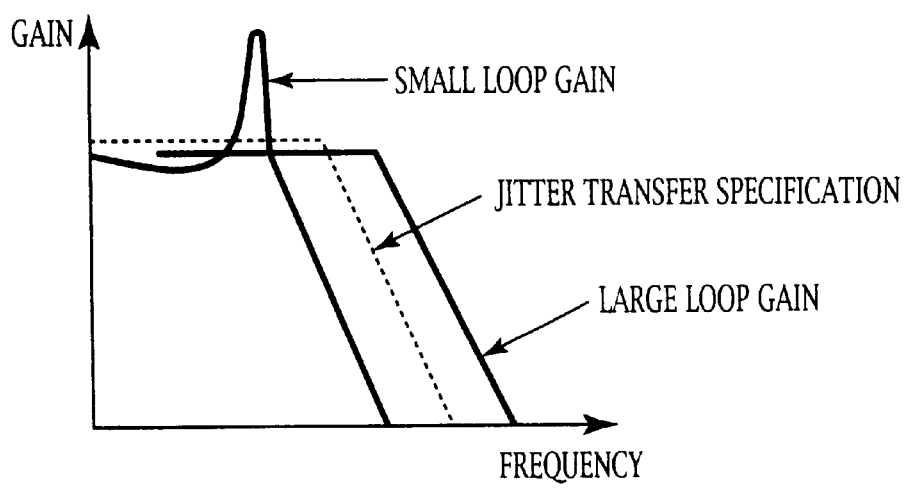
FIG. 22 is a diagram of PLL frequency characteristics when the loop gain is varied.

The LPF 6 smoothes the output current of the charge pump 30, and then outputs a smoothed voltage V. The LPF 6 is for example the complete second-order type filter shown in FIG. 18. The VCO 8 oscillates at an oscillation frequency according to the output voltage V of the LPF 6 to output the output clock. The VCO 8 is for example a ring oscillator. The lock detecting circuit 32 detects that the output clock of the VCO 8 and the input data coincide in phase with each other and thereby the PLL circuit is locked, and then outputs a lock detection signal to the VCO gain compensating circuit 34. The VCO gain compensating circuit 34 measures a gain Kv of the VCO 8 expressed by an equation (7), from an output frequency f1 of the VCO 8 when the PLL circuit is locked and an output frequency f2 of a dummy VCO when a voltage (V+ΔV) obtained by adding an offset voltage ΔV to the output voltage V of the LPF 6 when the PLL circuit is locked is applied to the dummy VCO having the same gain as that of the VCO 8.

$$Kv=\text{a change in the output frequency of the VCO 8/a change in the voltage}=(f2-f1)/\Delta V \quad (7)$$

Although it is desirable that f2 in the equation (7) be the output frequency of the VCO 8 at the voltage (V+ΔV), the output frequency of the VCO 8 cannot be changed while the VCO 8 is locked. Thus, the output frequency f2 is measured by using the dummy VCO having the same characteristics as those of the VCO 8. In this case, although the gain of the dummy VCO is also varied due to a change in the operating environment, the operating environment of the dummy VCO is the same as that of the VCO 8, and therefore the varied gain of the dummy VCO is presumed to be the same as that of the VCO 8. Thus, the gain Kv of the VCO 8 is detected. The VCO gain compensating circuit 34 compensates for a variation in the gain Kv of the VCO 8 due to a change in the temperature or a change in the operating environment such as power supply voltage, by controlling the gain of the charge pump 30 (amplitude current of the constant current source circuits) such that a product Ipmp×Kv of the gain Ipmp of the charge pump 30 and the gain Kv coincides with a target value C to correspond with a loop gain at which the PLL circuit meets the jitter transfer specification.

Figure 3:
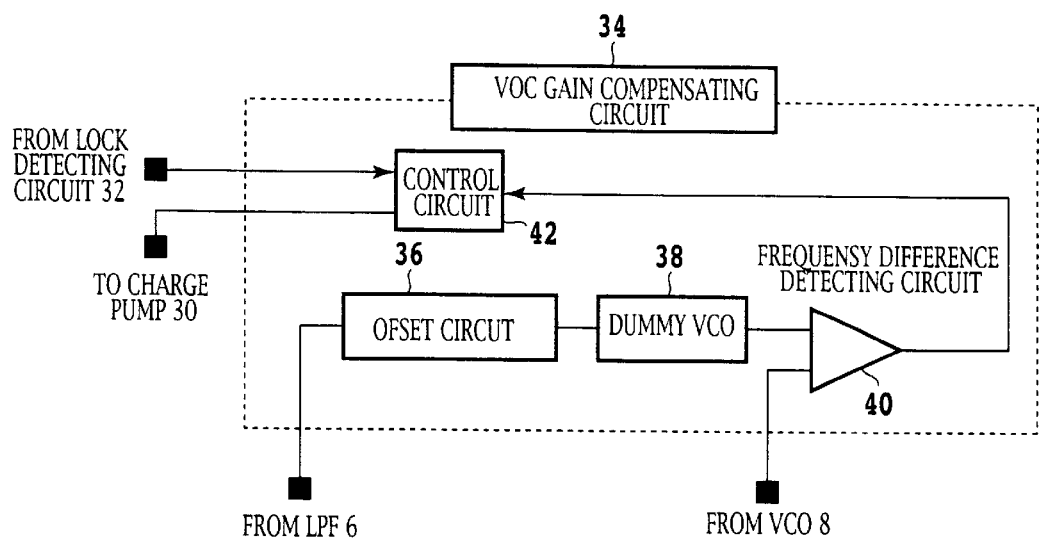
FIG. 3 is a block diagram of a VCO gain control circuit in FIG. 2.

FIG. 3 is a block diagram of the VCO gain compensating circuit 34 in FIG. 2. As shown in FIG. 3, the VCO gain control circuit 34 has an offset circuit 36, a dummy VCO 38, a frequency difference detecting circuit 40, and a control circuit 42. The offset circuit 36 adds an offset voltage ΔV to the output voltage V of the LPF 6, and then outputs a voltage (V+ΔV). Incidentally, the offset voltage ΔV is set to be of a value at which best accuracy of measurement of the gain Kv expressed by the equation (7) is obtained. The dummy VCO 38 oscillates according to the output voltage (V+ΔV) of the offset circuit 36 to output an output clock of the output frequency f2, and has characteristics identical with those of the VCO 8. The frequency difference detecting circuit 40 detects a difference between the output frequency f2 of the dummy VCO 38 and the output frequency f1 of the VCO 8.

Figure 4:
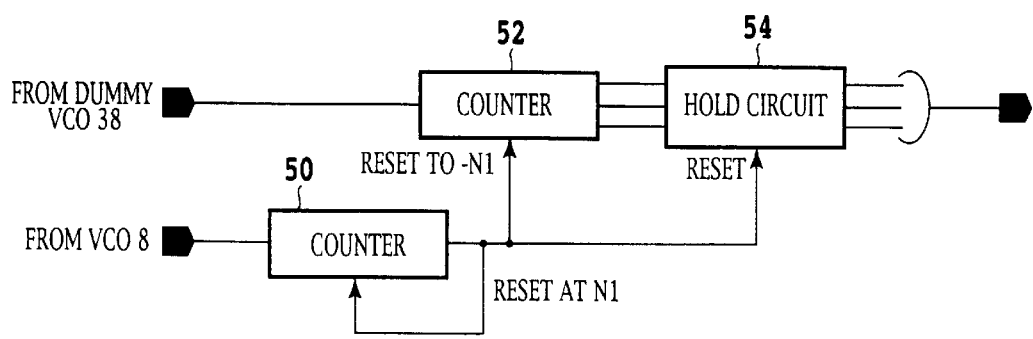
FIG. 4 is a block diagram of a frequency difference detecting circuit in FIG. 3.

FIG. 4 is a block diagram of the frequency difference detecting circuit 40 in FIG. 3. As shown in FIG. 4, the frequency difference detecting circuit 40 has counters 50 and 52 and a hold circuit 54. The counter 50 counts the output clock of the VCO 8, and outputs a reset signal on counting to a fixed value N1. The reset signal resets the counter 50 to zero and the counter 52 to −N1. The counter 52 counts the output clock of the dummy VCO 38, and is reset to −N1 by the reset signal. The hold circuit 54 holds a counter value N2 of the counter 52 immediately before the reset until a next reset. The hold circuit 54 is for example a flip-flop.

Since the output frequency of the VCO 8 is f1, a time required for the counter 50 to count to N1 is N1/f1. The counter 52 counts N1/f1÷(1/f2)=(N1×f2/f1) in the period of N1/f1. Hence, the counter value N2 of the counter 52 immediately before reset to −N1 is (N1×f2/f1−N1)=((f2−f1)/f1)×N1. Thus, the hold circuit 54 holds N2=((f2−f1)/f1)×N1. When the PLL circuit is locked, the frequency f1 is the frequency of bit rate of the input data and is constant. Therefore, the value of N2 is in proportion to the frequency difference (f2−f1).

When the lock detection signal indicates the locking of the PLL circuit, the control circuit 42 in FIG. 3 extracts the frequency difference (f2−f1) from N2=((f2−f1)/f1)×N1 outputted from the frequency difference detecting circuit 40. The control circuit 42 calculates the gain Kv of the VCO 8=(f2−f1)/ΔV expressed by the equation (7). The control circuit 42 calculates the gain Ipmp of the charge pump 30=the above target value C÷the measured gain Kv.

Operation of the PLL circuit of FIG. 2 will be described in the following.

(a) Phase Synchronization

The phase comparator 2 is supplied with NRZ data, or input data in optical communication or the like, and the output clock of the VCO 8. The phase comparator 2 compares the phases of the NRZ data and the output clock of the VCO 8 with each other, and then outputs to the charge pump 30 a phase difference signal formed by a pulse signal indicating the phase difference by a pulse width and an UP/DOWN signal indicating phase advance/delay of the output clock with respect to the NRZ data. When the lock detection signal does not indicate that the PLL circuit is locked, the VCO gain compensating circuit 34 effects control so that the above target value C÷(gain Kv of the VCO 8 expected in a standard operating environment) becomes the gain of the charge pump 30. The charge pump 30 outputs to the LPF 6 an output current of a current amplitude Ipmp controlled by the VCO gain compensating circuit 34.

The LPF 6, for example a complete second-order type filter smoothes the output current of the charge pump 30, and then outputs a smoothed voltage V. The VCO 8, for example a ring oscillator oscillates at an oscillation frequency according to the output voltage V of the LPF 6 to output the output clock. The output clock of the VCO 8 is fed back to the phase comparator 2. The frequency of the VCO 8 is controlled to correspond with the phase of the NRZ data by the phase comparator 2, the charge pump 30, and the LPF 6. As a result, the PLL circuit is locked.

(b) Lock Detection

The lock detecting circuit 32 detects coincidence of the phases of the NRZ data and the VCO 8 by comparing the phases of the NRZ data and the VCO 8 with each other, and outputs the lock detection signal indicating whether the PLL circuit is locked to the VCO gain compensating circuit 34.

(c) Detection of the Gain of the VCO 8

The offset circuit 36 in the VCO gain compensating circuit 34 adds an offset voltage $\Delta V$ to the output voltage V of the LPF 6, and then outputs a voltage $(V+\Delta V)$ to the dummy VCO 38. The counter 50 in the frequency difference detecting circuit 40 counts the output clock of the VCO 8, and outputs a reset signal on counting to a fixed value N1. The reset signal resets the counter 50 to zero and the counter 52 to −N1. The counter 52 counts the output clock of the dummy VCO 38, and is reset to −N1 by the reset signal. The hold circuit 54 holds the counter value $N2=((f2-f1)/f1) \times N1$ of the counter 52 immediately before the reset until a next reset. The dummy VCO 38 outputs an output clock of the oscillation frequency f2 according to the voltage $(V+\Delta V)$. When the lock detection signal indicates the locking of the PLL circuit, the control circuit 42 in FIG. 3 extracts the frequency difference (f2−f1) from $N2=((f2-f1)/f1) \times N1$ outputted from the frequency difference detecting circuit 40. The control circuit 42 calculates the gain Kv of the VCO $8=(f2-f1)/\Delta V$.

(d) Control of the Gain of the Charge Pump 30

The control circuit 42 calculates the gain Ipmp of the charge pump 30=(the above target value C÷the detected gain Kv). The control circuit 42 controls the constant current source circuit of the charge pump 30 so that the gain of the charge pump 30 coincides with the calculated gain Ipmp. Under control of the control circuit 42, the charge pump 30 outputs to the LPF 6 an output current of a current amplitude represented by the gain Ipmp. As a result, even when the gain of the VCO 8 is varied due to a change in the temperature or a change in the power supply voltage, the loop gain of the PLL circuit is made constant, and the PLL circuit meets the jitter transfer specification. In addition, it is possible to effect control to make the loop gain of the PLL circuit constant without unlocking the PLL circuit in operation.

Second Embodiment

Figure 5:
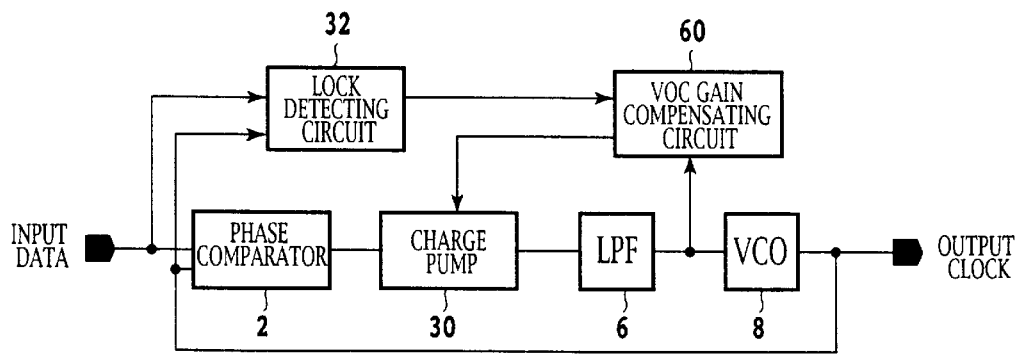
FIG. 5 is a block diagram of a PLL circuit according to a second embodiment of the present invention.

FIG. 5 is a block diagram of a PLL circuit according to a second embodiment of the present invention. In the figure, substantially the same components as components in FIG. 2 are identified by the same reference numerals. As shown in FIG. 5, the PLL circuit has a phase comparator 2, a charge pump 30, an LPF 6, a VCO 8, a lock detecting circuit 32, and a VCO gain compensating circuit 60.

The VCO gain compensating circuit 60 has a PLL frequency synthesizer circuit including a dummy VCO with characteristics identical with those of the VCO 8. The VCO gain compensating circuit 60 detects a gain Kv of the VCO 8 from an output voltage V1 of the LPF 6 when the PLL circuit is locked to a known frequency f1 of bit rate of NRZ data, an output voltage V2 of an LPF 72 when the PLL frequency synthesizer circuit is locked to a known frequency f2, and a frequency difference (f2−f1). The VCO gain compensating circuit 60 then controls a gain of the charge pump 30 so that a loop gain of the PLL circuit becomes constant.

Figure 6:
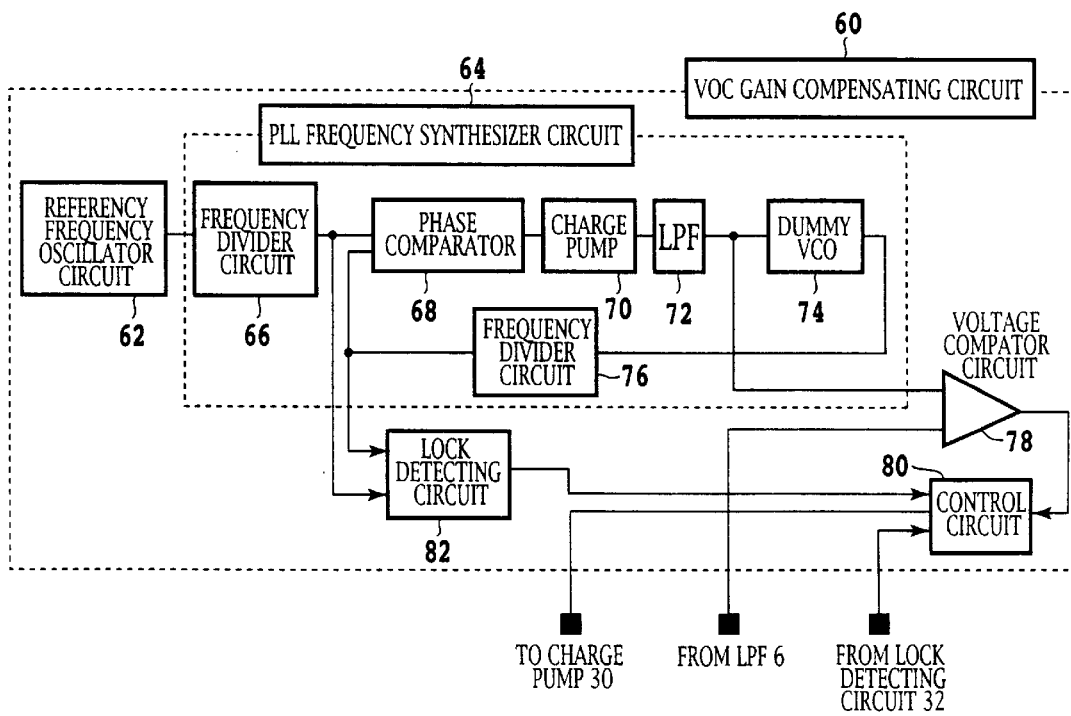
FIG. 6 is a block diagram of a VCO gain compensating circuit in FIG. 5.

FIG. 6 is a block diagram of the VCO gain compensating circuit 60 in FIG. 5. As shown in FIG. 6, the VCO gain compensating circuit 60 has a reference frequency oscillator circuit 62, a dummy frequency synthesizer circuit 64, a voltage comparator circuit 78, and a control circuit 80. The reference frequency oscillator circuit 62 outputs a clock signal of a reference frequency f3. The PLL frequency synthesizer circuit 64 has a frequency divider circuit 66, a phase comparator 68, a charge pump 70, an LPF 72, a dummy VCO 74, and a frequency divider circuit 76.

The frequency divider circuit 66 divides the reference clock of the reference frequency f3 with a frequency dividing ratio of 1/N1, and then outputs a clock of a frequency f3/N1. The phase comparator 68 detects a phase difference between the output clock of the frequency divider circuit 66 and an output clock of the frequency divider circuit 76, and then outputs a phase difference signal formed by a pulse signal indicating the phase difference by a pulse width and an UP/DOWN signal indicating phase delay/advance. The charge pump 70 converts the pulse signal into a current, and then outputs the current to the LPF 72. The LPF 72 smoothes the output current of the charge pump 70, and then outputs a smoothed voltage V2. The dummy VCO 74 oscillates at an oscillation frequency f2 according to the output voltage V2 of the LPF 72 to output an output clock. The frequency divider circuit 76 divides the output clock of the frequency f2 with a frequency dividing ratio of 1/N2. It is to be noted that when the PLL frequency synthesizer circuit 64 is locked, $f2=(f3 \times N2)/N1$.

The voltage comparator circuit 78 determines a difference voltage $\Delta V=(V2-V1)$ between the output voltage V1 of the LPF 6 and the output voltage V2 of the LPF 72. The voltage comparator circuit 78 is for example an operational amplifier. When lock detection signals of the lock detecting circuit 32 and a lock detecting circuit 82 indicate that the PLL circuit and the PLL frequency synthesizer circuit 64 are locked, respectively, the control circuit 80 calculates the gain Kv of the VCO 8 expressed by an equation (8) from the known frequency f2 of the dummy VCO 74, the known frequency f1 of bit rate of the input data, and the difference voltage $\Delta V$.

$$Kv=(f2-f1)/\Delta V \qquad (8)$$

The control circuit 80 calculates the gain Ipmp of the charge pump 30=(the above target value C÷the gain Kv detected by the equation (8)). The control circuit 80 controls the constant current source circuit of the charge pump 30 so that the gain of the charge pump 30 coincides with the calculated gain Ipmp. The lock detecting circuit 82 detects the locking of the PLL frequency synthesizer circuit 64 by comparing the output clocks of the frequency divider circuits 68 and 76 with each other, and outputs the lock detection signal.

Operation of the PLL circuit of FIG. 5 will be described in the following.

(a) Phase Synchronization is Obtained in the Same Manner as Described in (a) of the First Embodiment (b) Lock Detection The lock detecting circuit 32 detects coincidence of the phases of the NRZ data and the VCO 8 by comparing the phases of the NRZ data and the VCO 8 with each other, and outputs a lock detection signal to the VCO gain compensating circuit 34. In the meantime, the lock detecting circuit 82 detects the locking of the PLL frequency synthesizer circuit 64 by comparing the output clocks of the frequency divider circuits 68 and 76 with each other, and outputs a lock detection signal.

(c) Detection of the Gain of the VCO 8

The reference frequency oscillator circuit 62 in the VCO gain compensating circuit 60 outputs a clock signal of a frequency f2. The frequency divider circuit 66 divides the reference clock of the reference frequency f3 with a frequency dividing ratio of 1/N1, and then outputs a clock of a frequency f3/N1. The phase comparator 68 detects a phase difference between the output clock of the frequency divider circuit 66 and an output clock of the frequency divider circuit 76, and then outputs a phase difference signal formed by a pulse signal indicating the phase difference by a pulse width and an UP/DOWN signal indicating phase delay/advance. The charge pump 70 converts the pulse signal into an output current Ipmp or -Ipmp, and then outputs the output current to the LPF 72. The LPF 72 smoothes the output current of the charge pump 70, and then outputs a smoothed voltage V2.

The dummy VCO 74 oscillates at an oscillation frequency f2 according to the output voltage V2 of the LPF 72 to output an output clock. The frequency divider circuit 76 divides the output clock of the frequency f2 with a frequency dividing ratio of 1/N2. It is to be noted that when the PLL frequency synthesizer circuit 64 is locked, f2=(f3×N2)/N1. The voltage comparator circuit 78 determines a difference voltage ΔV= (V2−V1) between the output voltage V1 of the LPF 6 and the output voltage V2 of the LPF 72. When lock detection signals of the lock detecting circuit 32 and the lock detecting circuit 82 indicate that the PLL circuit and the PLL frequency synthesizer circuit 64 are locked, respectively, the control circuit 80 calculates the gain Kv of the VCO 8 expressed by the equation (8) from the known frequency f2 of the dummy VCO 72, the frequency f1 of bit rate of the input data, and the difference voltage ΔV.

(d) Control of the Gain of the Charge Pump 30

The control circuit 80 calculates the gain Ipmp of the charge pump 30=(the above target value C÷the gain Kv detected by the equation (8)). Under control of the control circuit 80, the charge pump 30 outputs to the LPF 6 a current of a current amplitude represented by the gain Ipmp. As a result, even when the gain of the VCO 8 is varied due to a change in the temperature or a change in the power supply voltage, the loop gain of the PLL circuit is made constant, and the PLL circuit meets the jitter transfer specification.

Third Embodiment

Figure 7:
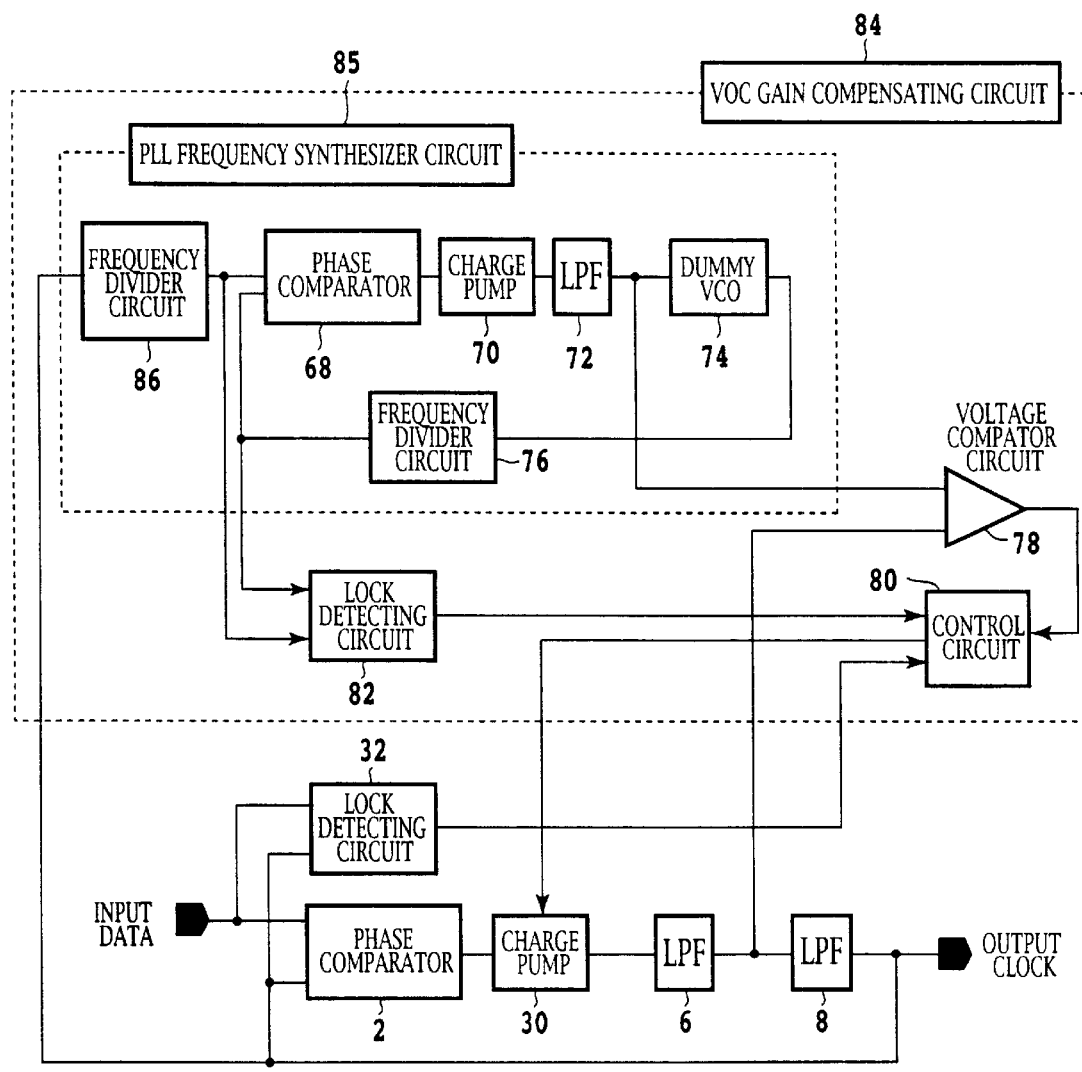
FIG. 7 is a block diagram of a PLL circuit according to a third embodiment of the present invention.

FIG. 7 is a block diagram of a PLL circuit according to a third embodiment of the present invention. In the figure, substantially the same components as components in FIG. 5 and FIG. 6 are identified by the same reference numerals. A VCO gain compensating circuit 84 is different from the VCO gain compensating circuit 60 in FIG. 6 in that an input clock of a frequency divider circuit 86 in the VCO gain compensating circuit 84 is an output clock of a VCO 8. Letting oscillation frequency of the VCO 8 when the PLL circuit is locked be f1 and oscillation frequency of a dummy VCO 74 be f2=(f1×N4)/N3, frequency dividing ratios N3 and N4 of frequency divider circuits 86 and 88 in a PLL synthesizer circuit 85 are set to be of a value at which a gain Kv of the VCO 8 can be measured with good accuracy. Operation of the PLL circuit in FIG. 7 is the same as that of the PLL circuit in FIG. 6 except that the output clock of the VCO 8 is inputted to the frequency divider circuit 86. Therefore, description of the operation of the PLL circuit in FIG. 7 will be omitted.

Fourth Embodiment

Figure 8:
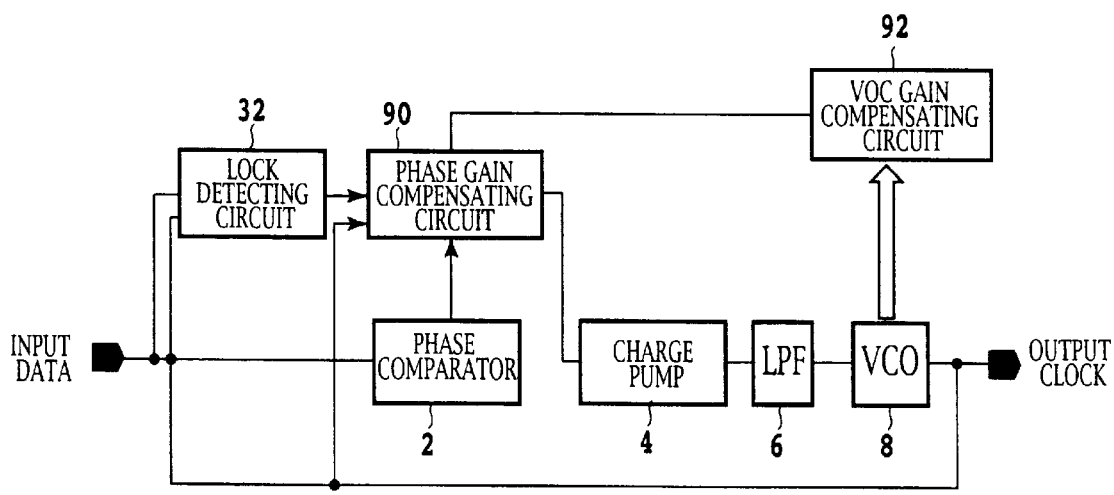
FIG. 8 is a block diagram of a PLL circuit according to a fourth embodiment of the present invention.

FIG. 8 is a block diagram of a PLL circuit according to a fourth embodiment of the present invention. In the figure, substantially the same components as components in FIG. 2 are identified by the same reference numerals. As shown in FIG. 5, the PLL circuit has a phase comparator 2, a charge pump 4, an LPF 6, a VCO 8, a lock detecting circuit 32, a phase gain compensating circuit 90, and a VCO gain compensating circuit 92.

On the basis of a value M expressed by an equation (9) which value is in inverse proportion to a gain Kv of the VCO 8 and is outputted from the VCO gain compensating circuit 92, the phase comparator gain control circuit 90 masks a pulse signal of the phase comparator 2 with a probability of about (N−M)/N to thereby control a gain Kph of the phase comparator 2.

$$M=(Kv\text{min}/Kv)\times N \quad (9)$$

where Kvmin is a minimum gain predicted on the basis of the operating environment and the like of the VCO 8; and Kv is the gain of the VCO 8. Letting T be a cycle of controlling the gain of the phase comparator 2, N=T/f1, where f1 is a frequency equal to bit rate of NRZ data.

The gain Kph of the phase comparator 2, a gain Ipmp of the charge pump 4, and a transfer function of the LPF 6 are set such that a loop gain of the PLL circuit meets the jitter transfer specification when the gain of the VCO 8 is the minimum gain Kvmin. In this case, let C2 be a product of the gain Kvmin and the gain Kph when the pulse signal of the phase comparator 2 is allowed to pass through. A gain Kph1 when the pulse signal is masked with a probability of (N−M)/N (0≦M≦N) and is allowed to pass through with a probability of M/N substantially coincides with (Kph×M)/N. A product of Kph1 and the gain Kv of the VCO 8 is C2, and thus the loop gain of the PLL circuit is made substantially constant.

Figure 9:
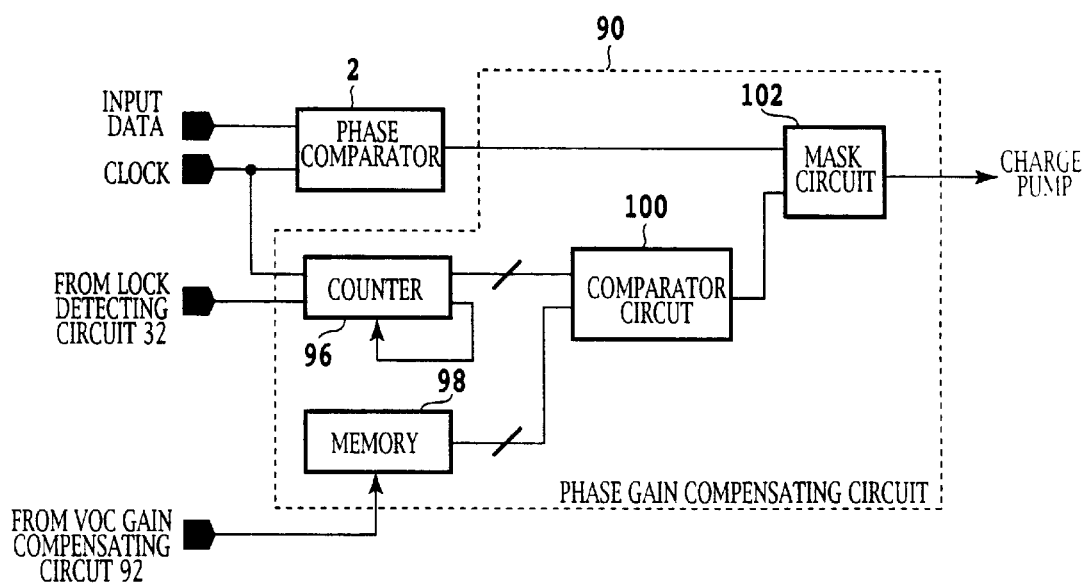
FIG. 9 is a block diagram of a phase gain compensating circuit in FIG. 8.

FIG. 9 is a block diagram of the phase gain compensating circuit 90 in FIG. 8. As shown in FIG. 9, the phase gain compensating circuit 90 has a counter 96, a memory 98, a comparator circuit 100, and a mask circuit 102. When a lock detection signal indicates that the PLL circuit is locked, the counter 96 counts an output clock of the VCO 8, and is reset to a counter value=0 on counting to a counter value=N. When the lock detection signal does not indicate that the PLL circuit is locked, the counter 96 remains at the counter value=0, that is the count operation is stopped. The VCO gain compensating circuit 92 writes the value M to the memory 98. The comparator circuit 100 compares the counter value of the counter 96 with the stored value M of the memory 98, and then outputs an "L" when the counter value is smaller than M and an "H" when the counter value is larger than M. The mask circuit 102 outputs the output of the phase comparator 2 as it is while the output of the comparator circuit 100 is an "L," and masks the output of the phase comparator 2 while the output of the comparator circuit 100 is an "H." The VCO gain compensating circuit 92 detects the gain Kv of the VCO 8 in the same manner as in the first to third embodiments. The VCO gain compensating circuit 92 then calculates the value M expressed by the equation (9), and writes the value M to the memory 98.

Figure 10:
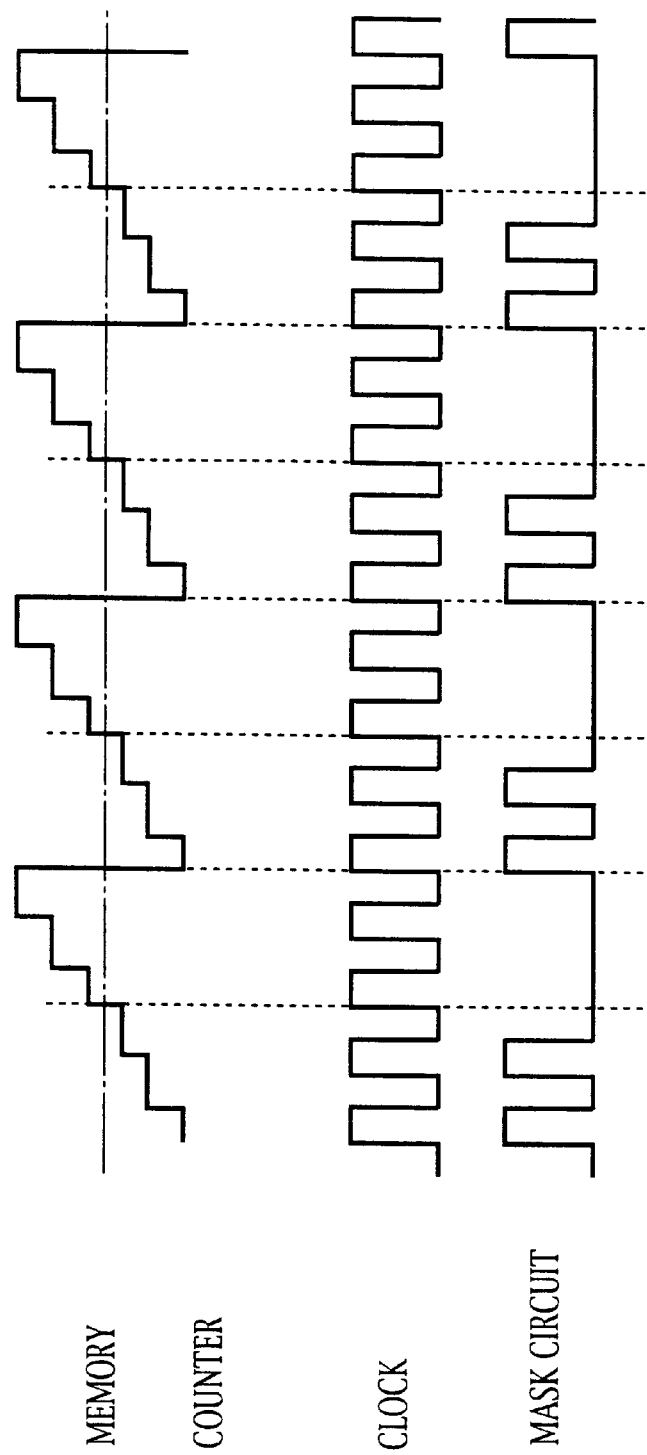
FIG. 10 is a time chart of FIG. 9.

FIG. 10 is a time chart of FIG. 9. Operation of FIG. 8 will be described in the following with reference to FIG. 10.

(a) Phase Synchronization is Obtained in the Same Manner as Described in (a) of the First Embodiment (b) The Lock Detecting Circuit 32 Detects Coincidence of the Phases of the NRZ Data and the VCO 8 by Comparing the Phases of the NRZ Data and the VCO 8 With Each Other, and Outputs a Lock Detection Signal to the Phase Gain Compensating Circuit 90

(c) Detection of the Gain of the VCO 8

The VCO gain compensating circuit 92 detects the gain Kv of the VCO 8 in the same manner as in the first to third embodiments. The VCO gain compensating circuit 92 then calculates the value M expressed by the equation (9), and writes the value M to the memory 98 in FIG. 9.

(d) Control of the Gain of the Phase Comparator 2

When a lock detection signal indicates that the PLL circuit is locked, the counter 96 counts an output clock of the VCO 8, and is reset to a counter value=0 on counting to a counter value=N. When the lock detection signal does not indicate that the PLL circuit is locked, the counter 96 remains at the counter value=0, that is the count operation is stopped. The comparator circuit 100 compares the counter value of the counter 96 with the stored value M of the memory 98, and then outputs an "L" when the counter value is smaller than M and an "H" when the counter value is larger than M. As shown in FIG. 10, the mask circuit 102 outputs the output of the phase comparator 2 as it is while the output of the comparator circuit 100 is an "L," and masks the output of the phase comparator 2 while the output of the comparator circuit 100 is an "H." As a result, the output of the comparator circuit 100 is the "H" during a period of (N−M)/f1 (f1 is the frequency of the output clock of the VCO 8) and the "L" during a period of M/f1 in each cycle of N/f1, whereby the pulse signal of the phase comparator 2 is masked with the probability of (N−M)/N. Thus, with the pulse signal of the phase comparator 2 after masking by the mask circuit 102, the gain Kph1 substantially coincides with Kph×M/N=Kph×(Kvmin/Kv). Kph1 ×Kv=C2, and therefore even when edge rate and the gain of the VCO 8 are varied, the loop gain of the PLL circuit is made substantially constant.

Fifth Embodiment

Figure 11:
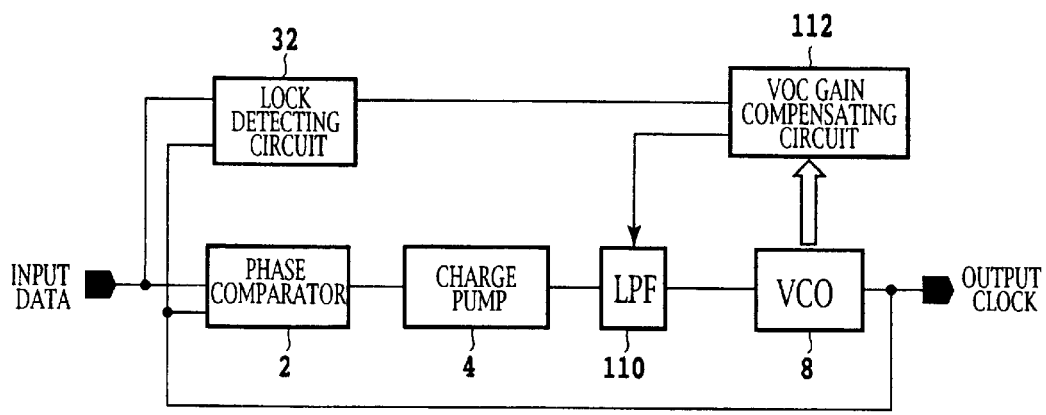
FIG. 11 is a block diagram of a PLL circuit according to a fifth embodiment of the present invention.

FIG. 11 is a block diagram of a PLL circuit according to a fifth embodiment of the present invention. In the figure, substantially the same components as components in FIG. 2 are identified by the same reference numerals. As shown in FIG. 11, the PLL circuit has a phase comparator 2, a charge pump 4, a filter 112, a lock detecting circuit 32, a VCO 120, and a VCO gain compensating circuit 122. The VCO gain compensating circuit 112 detects a gain of the VCO 8 in the same manner as in the first to third embodiments, and controls a transfer function of the LPF 110 so as to make a loop gain of the PLL circuit constant. The LPF 110 is a loop filter whose transfer function is controlled by the VCO gain compensating circuit 112. In the fifth embodiment, the LPF 110 is formed by the complete second-order type filter shown in FIG. 18. In this case, resistance of the LPF 110 is made variable. When the LPF 110 is formed by the complete second-order type filter, the loop gain of the PLL circuit is expressed by the equation (6), and thus a gain of the phase comparator 2, a gain of the charge pump 4, the resistance of the LPF 110, and the gain of the VCO 8 are set so as to meet the jitter transfer specification. A product of the resistance of the LPF 110 and the gain of the VCO 8 in this case is set to be C3. The VCO gain compensating circuit 112 controls the value of the resistance of the LPF 110 so that the product of a measured gain Kv of the VCO 8 and the value of the resistance of the LPF 110 equals C3.

Operation of the PLL circuit of FIG. 11 will be described in the following.

(a) Phase Synchronization Between an Output Clock of the VCO 8 of the PLL Circuit and NRZ Data is Obtained in the Same Manner as Described in (a) of the First Embodiment (b) The Lock Detecting Circuit 32 Detects Coincidence of the Phases of the NRZ Data and the VCO 8 by Comparing the Phases of the NRZ Data and the VCO 8 With Each Other, and Outputs a Lock Detection Signal to the VCO Gain Compensating Circuit 112

(c) Detection of the Gain of the VCO 8

The VCO gain compensating circuit 112 detects the gain Kv of the VCO 8 in the same manner as in the first to third embodiments.

(d) Control of the Resistance of the LPF 112

When the lock detection signal of the lock detecting circuit 32 indicates that the PLL circuit is locked, the VCO gain compensating circuit 112 calculates R1=(the above C3÷the detected gain Kv of the VCO 8). The VCO gain compensating circuit 112 then effects control so that the resistance of the LPF 112 coincides with the calculated resistance value R1. Thus, the loop gain of the PLL circuit is made constant.

Sixth Embodiment

Figure 12:
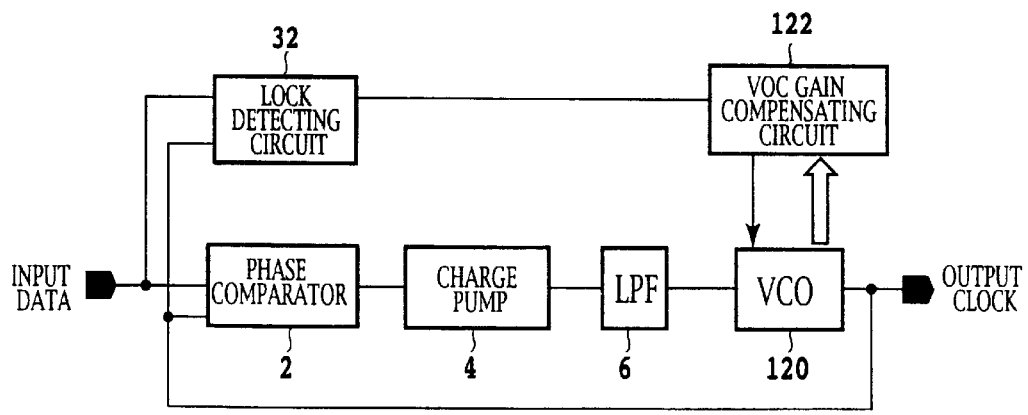
FIG. 12 is a block diagram of a PLL circuit according to a sixth embodiment of the present invention.

FIG. 12 is a block diagram of a PLL circuit according to a sixth embodiment of the present invention. In the figure, substantially the same components as components in FIG. 2 are identified by the same reference numerals. As shown in FIG. 12, the PLL circuit has a phase comparator 2, a charge pump 4, an LPF 6, a lock detecting circuit 32, a VCO 120, and a VCO gain compensating circuit 122. The VCO gain compensating circuit 122 detects a gain of the VCO 120 in the same manner as in the first to third embodiments, and controls the gain of the VCO 120 so as to make a loop gain of the PLL circuit constant. The VCO 120 has its gain controlled by the VCO gain compensating circuit 122. The VCO 120 is a ring oscillator circuit, for example. In this case, the gain of the VCO 120 is determined by delay time of each inverter forming the ring oscillator circuit, and therefore the delay time is controlled to obtain a desired gain.

Operation of the PLL circuit of FIG. 11 will be described in the following.

(a) Phase Synchronization Between an Output Clock of the VCO 120 of the PLL Circuit and NRZ Data is Obtained in the Same Manner as Described in (a) of the First Embodiment (b) The Lock Detecting Circuit 32 Detects Coincidence of the Phases of the NRZ Data and the VCO 120 by Comparing the Phases of the NRZ Data and the VCO 120 With Each Other, and Outputs a Lock Detection Signal to the VCO Gain Compensating Circuit 122

(c) Detection of the Gain of the VCO 120

The VCO gain compensating circuit 122 detects the gain Kv of the VCO 120 in the same manner as in the first to third embodiments.

(d) Control of the Gain of the VCO 120

When the lock detection signal of the lock detecting circuit 32 indicates that the PLL circuit is locked, the VCO gain compensating circuit 122 controls the VCO 120 so as to make the gain of the VCO 120 constant. Thus, the loop gain of the PLL circuit is made constant.

Seventh Embodiment

Figure 13:
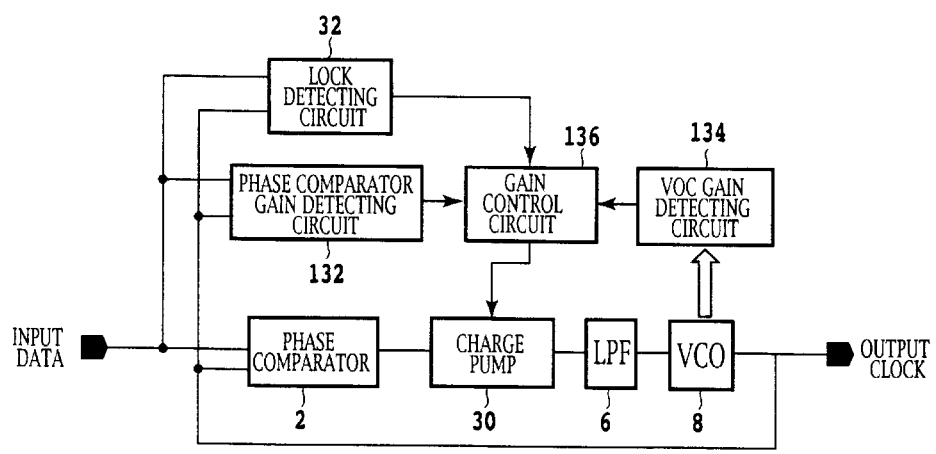
FIG. 13 is a block diagram of a PLL circuit according to a seventh embodiment of the present invention.

FIG. 13 is a block diagram of a PLL circuit according to a seventh embodiment of the present invention. In the figure, substantially the same components as components in FIG. 2 are identified by the same reference numerals. As shown in FIG. 13, the PLL circuit has a phase comparator 2, a charge pump 30, an LPF 6, a VCO 8, a lock detecting circuit 32, a phase comparator gain detecting circuit 132, a VCO gain detecting circuit 134, and a gain control circuit 136. Since a clock extracting PLL circuit generally compares the phases of the clock and data with each other only when an edge of data arrives, a gain Kph of the phase comparator 2 is varied greatly depending on the data pattern, and thus cut-off frequency is varied greatly. For example, in a pattern in which NRZ data is formed by a repetition of "10," a rising edge and a falling edge arrive alternately, and hence the edge rate is 100%, whereas in a "1100" pattern, a rising edge and a falling edge each arrive only once in four bits, and hence the edge rate is 50%. The gain Kph of the phase comparator is in proportion to the edge rate, and therefore the gain Kph of the phase comparator 2 is varied by a factor of about 2 between "10" and "1100." Further, when the same code arrives continuously, the gain Kph of the phase comparator 2 is varied more greatly.

The phase comparator gain detecting circuit 132 detects the edge rate of NRZ data. The VCO gain detecting circuit 134 detects a gain Kv of the VCO 8 in the same manner as in the first to third embodiments. The gain Kph of the phase comparator 2, a gain Ipmp of the charge pump 30, a transfer function F(s) of the LPF 6, and a standard gain Kv of the VCO 8 are set such that a loop gain of the PLL circuit determined by the gain Kph of the phase comparator 2, the gain Ipmp of the charge pump 30, the transfer function F(s) of the LPF 6, and the standard gain Kv of the VCO 8 when the edge rate is constant, for example 100% meets the jitter transfer specification. A product of the gain Kph of the phase comparator 2×the gain Ipmp of the charge pump 30×the gain Kv of the VCO 8 in this case is set to be C4. The gain control circuit 136 calculates K=C4÷(the gain Kv detected in a locked state×the edge rate of input data×the phase gain Kph when the edge rate is 100%). The gain control circuit 136 then controls the charge pump 30 so that the gain Ipmp equals K.

Figure 14:
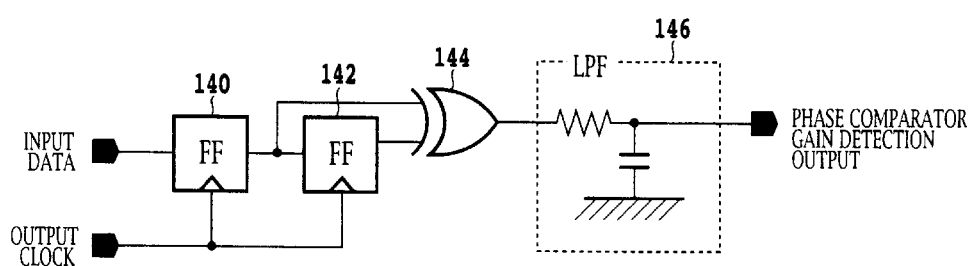
FIG. 14 is a block diagram of a phase comparator gain detecting circuit in FIG. 13.

FIG. 14 is a block diagram of the phase comparator gain detecting circuit 132 in FIG. 13. As shown in FIG. 14, the phase comparator gain detecting circuit 132 has a flip-flop (FF) 140, an FF 142, an EX-OR gate 144, and an LPF 146. The FF 140 latches data in timing coinciding with a rising or falling edge of the output clock of the VCO 8. The FF 142 latches the output of the FF 140 in timing coinciding with an edge of the output clock of the VCO 8. For example, when the FF 140 holds an Nth bit of the NRZ data, the FF 142 holds an (N−1)th bit of the NRZ data.

The EX-OR gate 146 outputs an "L" when the outputs of the FFs 140 and 142 coincide with each other ((0, 0) or (1, 1)), and outputs an "H" when the outputs of the FFs 140 and 142 do not coincide with each other ((0, 1) or (1, 0)). Consequently, the output of the XOR gate 146 is the "H" when an edge of the input data arrives, and is the "L" when an edge of the input data does not arrive. The LPF 146 is an integrating circuit for averaging the output of the EX-OR gate 144. Since an output voltage Vc of the LPF 146 is changed according to a time constant τ (resistance R×capacitance C), the time constant τ is set such that level of the output voltage Vc represents the edge rate. For example, when input data with an edge rate of 100% is inputted continuously, the output voltage Vc of the LPF 146 coincides with a voltage level Vi for the output of the EX-OR gate 144="H," and thus the time constant τ is set such that, letting the edge rate of the input data be α%, the output voltage Vc of the LPF 146=α×Vi/100.

Figure 15:
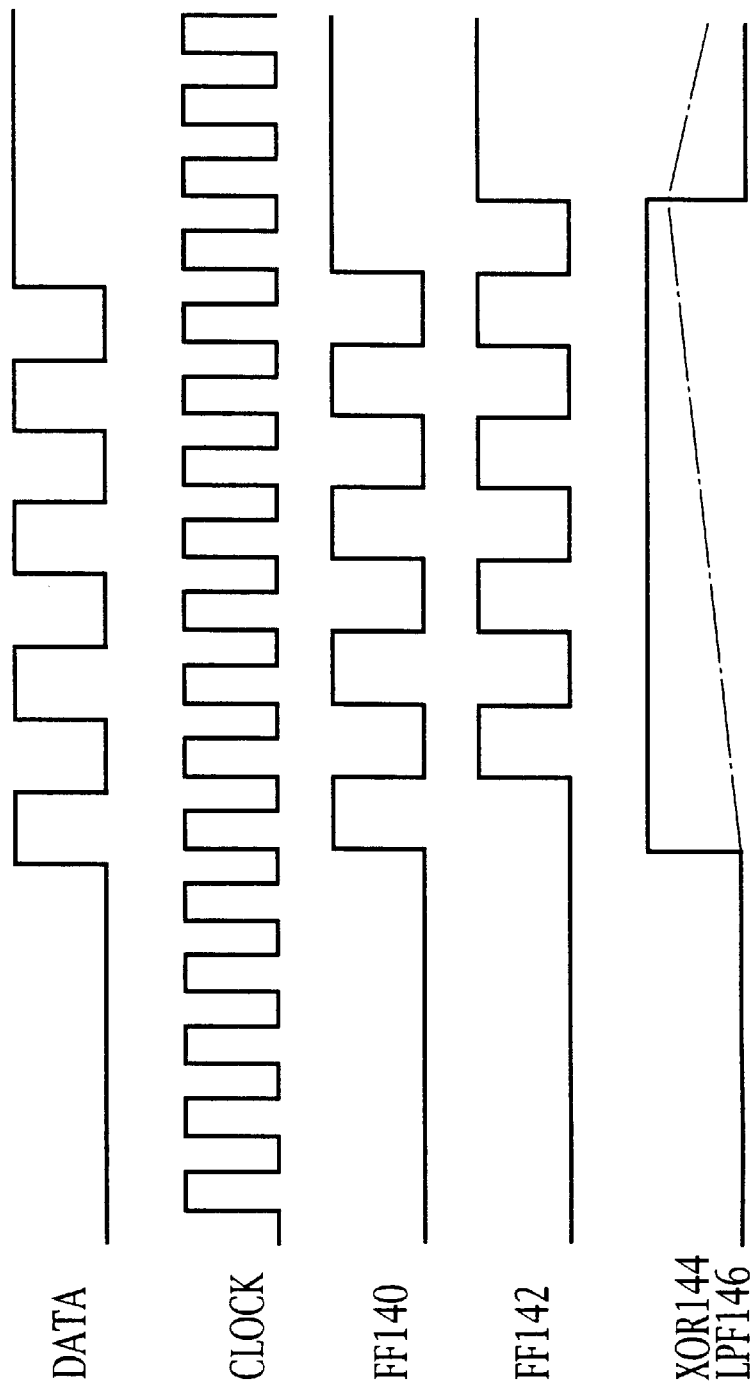
FIG. 15 is a time chart of FIG. 14.

FIG. 15 is a time chart of FIG. 14. Operation of the PLL circuit of FIG. 14 will be described in the following with reference to FIG. 15.

(a) Phase Synchronization Between the Output Clock of the VCO 8 of the PLL Circuit and the NRZ Data is Obtained in the Same Manner as Described in (a) of the First Embodiment (b) The Lock Detecting Circuit 32 Detects Coincidence of the Phases of the NRZ Data and the Output Clock of the VCO 8 by Comparing the Phases of the NRZ Data and the Output Clock of the VCO 8 With Each Other, and Outputs a Lock Detection Signal to the Gain Control Circuit 136

(c) Detection of the Gain of the VCO 8

The VCO gain compensating circuit 122 detects the gain Kv of the VCO 8 in the same manner as in the first to third embodiments. The VCO gain detecting circuit 134 then outputs the gain Kv of the VCO 8 to the gain control circuit 136.

(d) Detection of the Gain of the Phase Comparator

The FF 140 in the phase comparator gain detecting circuit 132 latches the NRZ data at an edge of the output clock of the VCO 8. The FF 142 latches the output of the FF 140 at an edge of the output clock of the VCO 8. The EX-OR gate 146 outputs an "L" when the outputs of the FFs 140 and 142 coincide with each other, and outputs an "H" when the outputs of the FFs 140 and 142 do not coincide with each other. Consequently, the output of the XOR gate 146 is the "H" when an edge of the NRZ data arrives, and is the "L" when an edge of the NRZ data does not arrive. The LPF 146 averages the output of the EX-OR gate 144 Vc, and outputs the result to the gain control circuit 136.

(e) Gain Control

The gain control circuit 136 calculates K=the above C4÷(the detected gain Kv×the voltage Vc/the voltage Vi×the phase gain Kph when the edge rate is 100%). The gain control circuit 136 then controls the charge pump 30 so that the gain Ipmp equals K.

Thus, even when there are a variation in the gain Kv of the VCO 8 and a variation in the phase gain Kph of the phase comparator 2 as a result of a change in the edge rate of the NRZ data, the loop gain of the PLL circuit is made constant.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A PLL circuit having a gain control function, said PLL circuit comprising:

a first phase comparator for outputting a first phase difference signal indicating a phase difference between a first input signal and a second input signal;

a first loop filter for smoothing a signal based on said first phase difference signal and outputting a first control voltage;

a VCO (voltage-controlled oscillator circuit) for oscillating at a frequency based on said first control voltage and thereby outputting a first clock;

a dummy VCO having characteristics identical with those of said VCO for oscillating at a frequency based on a second control voltage and thereby outputting a second clock;

a VCO gain detecting circuit for detecting a gain of said VCO on the basis of a frequency difference between said first clock and said second clock and a voltage difference between said first control voltage and said second control voltage; and a gain control circuit for effecting control so as to make a loop gain constant on the basis of the gain of said VCO detected by said VCO gain detecting circuit;

wherein said second input signal is a signal based on said first clock.

2. A PLL circuit having a gain control function as claimed in claim 1, further comprising an offset circuit for adding an offset voltage to said first control voltage and outputting a voltage obtained by the addition as said second control voltage to said dummy VCO.

3. A PLL circuit having a gain control function as claimed in claim 1, further comprising a lock detecting circuit for detecting whether said first input signal and said second input signal coincide in phase with each other and thereby detecting whether said PLL circuit is locked, wherein said gain control circuit effects control so as to make said loop gain constant when said lock detecting circuit detects that said PLL circuit is locked.

4. A PLL circuit having a gain control function as claimed in claim 1, further comprising: a second phase comparator for outputting a second phase difference signal indicating a phase difference between a third clock of a known frequency and a fourth clock based on said second clock of said dummy VCO; and a second loop filter for smoothing a signal based on said second phase difference signal and outputting said second control voltage to said dummy VCO.

5. A PLL circuit having a gain control function as claimed in claim 4, further comprising a reference frequency oscillator circuit for outputting a fourth clock of a known third frequency, wherein said third clock is a signal based on said fourth clock.

6. A PLL circuit having a gain control function as claimed in claim 4, wherein said third clock is a signal based on said first clock.

7. A PLL circuit having a gain control function as claimed in claim 1, further comprising a charge pump for converting said first phase difference signal, said first phase difference signal indicating the phase difference by a pulse width, into a current, and outputting the output current of an amplitude current Ipmp to said first loop filter, wherein said gain control circuit controls said amplitude current of said charge pump so as to make a product of the gain of said VCO and said amplitude current constant.

8. A PLL circuit having a gain control function as claimed in claim 7, wherein said gain control circuit calculates $\alpha$=(a minimum gain of said VCO/the gain detected by said VCO gain detecting circuit) ($0 \leq \alpha \leq 1$), masks said first phase difference signal with a probability of $(1-\alpha)$, and outputs a result to said charge pump.

9. A PLL circuit having a gain control function as claimed in claim 8, wherein said gain control circuit includes: a memory for storing a value M based on M1=N×$\alpha$ (N is a natural number); a counter for counting from zero to N on the basis of a fifth clock; a comparator for comparing said M and a counter value of said counter with each other; and a mask circuit for masking said first phase difference signal on the basis of a result of the comparison of said comparator, and outputting a result to said charge pump.

10. A PLL circuit having a gain control function as claimed in claim 1, wherein said VCO gain detecting circuit includes: a first counter for repeatedly counting from zero to N1 on the basis of said first clock, outputting a reset signal on counting to said N1, and thereby being reset to zero; a second counter for counting on the basis of said second clock and being reset to −N1 by said reset signal; and a hold circuit for holding a counter value of said second counter immediately before said second counter is reset; and said VCO gain detecting circuit calculates said frequency difference on the basis of the value held by said hold circuit.

* * * * *